United States Patent
Saijo et al.

(10) Patent No.: US 7,284,320 B2
(45) Date of Patent: Oct. 23, 2007

(54) MULTILAYER PRINTED WIRING BOARD AND METHOD OF MANUFACTURING THE SAME

(75) Inventors: Kinji Saijo, Yamaguchi-ken (JP);
Kazuo Yoshida, Yamaguchi-ken (JP);
Hiroaki Okamoto, Yamaguchi-ken (JP); Shinji Ohsawa, Yamaguchi-ken (JP)

(73) Assignee: Toyo Kohan Co., Ltd., Tokyo (JP)

( * ) Notice: Subject to any disclaimer, the term of this patent is extended or adjusted under 35 U.S.C. 154(b) by 136 days.

(21) Appl. No.: 11/119,820

(22) Filed: May 3, 2005

(65) Prior Publication Data

US 2005/0193555 A1 Sep. 8, 2005

Related U.S. Application Data

(62) Division of application No. 10/168,403, filed as application No. PCT/JP00/09070 on Dec. 21, 2000, now abandoned.

(30) Foreign Application Priority Data

Dec. 22, 1999 (JP) ................................. 11-363952

(51) Int. Cl.
*H05K 3/36* (2006.01)
(52) U.S. Cl. ............................. 29/830; 29/832; 29/846; 29/847
(58) Field of Classification Search .................. 29/830, 29/832, 847, 846
See application file for complete search history.

(56) References Cited

U.S. PATENT DOCUMENTS

| | | | | |
|---|---|---|---|---|
| 4,854,040 | A | * | 8/1989 | Turek ........................... 29/847 |
| 5,072,075 | A | * | 12/1991 | Lee et al. ..................... 174/264 |
| 5,357,138 | A | | 10/1994 | Kobayashi |
| 5,828,555 | A | * | 10/1998 | Itoh ............................. 361/784 |
| 6,351,393 | B1 | * | 2/2002 | Kresge et al. ............... 361/795 |
| 6,373,717 | B1 | * | 4/2002 | Downes, Jr. et al. ........ 361/795 |
| 6,829,823 | B2 | * | 12/2004 | Downes, Jr. et al. ......... 29/852 |
| 7,024,764 | B2 | * | 4/2006 | Kresge et al. ................ 29/840 |
| 7,059,039 | B2 | * | 6/2006 | Tsukamoto et al. ........... 29/830 |
| 2005/0193555 | A1 | * | 9/2005 | Saijo et al. .................... 29/830 |

OTHER PUBLICATIONS

Kaneyama, Fumiyasu. "Signal Line Branch Structure for High Speed Signal Multi-Layer Substrate," publication number 06-326506 (JP 6326506 A), Nov. 25, 1994.

* cited by examiner

*Primary Examiner*—Carl J. Arbes
(74) *Attorney, Agent, or Firm*—Browdy and Neimark, PLLC

(57) ABSTRACT

A multilayer printed wiring board having a wiring lead-out port has a signal circuit conductor perfectly covered by an earth circuit in its inside and a wiring lead-out port. A signal circuit conductor having a branch pattern is preferable. A large number of products can be easily manufactured with good size reproducibility. The multilayer printed wiring board is manufactured by selectively etching the copper of a cladding sheet manufactured by bonding a copper foil to a nickel foil with 0.1-3 % reduction and forming a signal circuit conductor covered by an earth circuit and the wiring lead-out port.

11 Claims, 8 Drawing Sheets

MULTILAYER PRINTED WIRING BOARD AND METHOD OF MANUFACTURING THE SAME

This is a division of parent application Ser. No. 10/168,403, nationalized Nov. 27, 2002 now abandoned, which is the U.S. national phase of International application PCT/JP00/09070 filed Dec. 21, 2000.

TECHNICAL FIELD

The present invention relates to a structure of a multilayer printed wiring board, a cladding sheet used therefor and a method of manufacturing a multilayer printed wiring board having the structure, particularly to an electric circuit connector of a connector pin or the like.

BACKGROUND OF THE INVENTION

In recent years, by highly integrated formation and high-speed formation of a semiconductor device, small-sized formation and high function formation of an electronic apparatus have been progressed. The high speed formation of an electronic apparatus seems to further develop in the future, however, according to a circuit of a high frequency wave exceeding 50 MHz, there pose various problems owing to electric characteristics of wirings. For example, although a microstrip structure has widely been used conventionally as a wiring structure of a high frequency wave circuit, in accordance with small-sized formation and high function formation of an electronic apparatus, a wiring pattern width is reduced and according to a microstrip structure, it has been difficult to restrain crosstalk noise generated among wirings. Further, high speed formation of a signal help increase crosstalk noise and it is difficult to restrain crosstalk noise in a microstrip wiring structure.

As a constitution aiming to resolve the above-described problem, there is a proposal of Japanese Patent Laid-Open No. 283930/1997. The proposal is a multilayer printed wiring board comprising a film adhering base material laminatedly constituted by a copper-clad laminated sheet formed with an earth circuit conductor and a film-like copper-clad laminated sheet formed with an earth circuit conductor and a signal circuit conductor, and a through hole, forming a coaxial circuit structure on the wiring board. By constructing such a constitution, there can be formed a coaxial circuit having a strip structure in which the signal circuit conductor is completely covered by the earth circuit conductor and a via hole for interlayer connection between inner layers can also be provided and there can be provided a multilayer printed wiring board constituting a high speed signal transmission line which is not effected with influence of radiated noise or crosstalk noise.

The multilayer printed wiring board is provided with a hole of through hole for interlayer connection. According to a method of manufacturing the multilayer printed wiring board, firstly, a copper-clad laminated sheet formed with an earth circuit conductor and a film-like copper-clad laminated sheet formed with an earth circuit conductor and a signal circuit conductor, are fabricated separately from each other, and laminated to each other to thereby construct a constitution of an integrated-type circuit structure of a coaxial structure and by perforating the structure for constituting a through hole and inserting a short circuit pin provided with a contact point into a necessary one of the through hole, an apparatus board or the like can be set and a via hole for interlayer connection between inner layers is formed not by perforating but by copper plating and etching treatment.

However, according to the method of Japanese Patent Laid-Open No. 283930/1997, it is necessary to form a hole having a diameter equivalent to a diameter of a land of the copper-clad laminated sheet in a nonreflow type prepreg. Further, in laminating and integrating the copper-clad laminated sheet formed with the through hole and the nonreflow type prepreg formed with the hole, there poses a problem that it is necessary to match positions of the through hole of the copper-clad laminated sheet and the hole of the nonreflow type prepreg.

It is an object of the invention to resolve the above-described problem of the conventional technology and provide a manufacturing method capable of manufacturing a multilayer printed wiring board by simple and convenient steps and capable of manufacturing the multilayer printed wiring board inexpensively by mass production. Further, it is other object of the invention to provide a manufacturing method capable of efficiently forming a wiring lead-out port of a multilayer printed wiring board.

DISCLOSURE OF THE INVENTION

In order to achieve the above-described object, the inventors have finished the invention by reaching a conclusion that it is mostly preferable to adopt a manufacturing method of manufacturing a total of a wiring board by an etching treatment and providing a wiring lead-out port at the stage.

That is, a multilayer printed wiring board according to the invention is characterized in including a signal circuit conductor completely covered by an earth circuit at an inner portion thereof as well as providing a lead-out port.

According to the invention, it is not necessary to carry out a complicated processing of laminating a necessary number of temporarily laminated articles and integrating the articles by carrying out the actual lamination and therefore, it is not necessary to form a hole having a diameter equivalent to a diameter of a land of a copper-clad laminated board at a nonreflow type prepreg, further, it is not necessary to carry out a complicated processing of confirming whether positions of a through hole of the copper-clad laminated board previously fabricated and the hole of the nonreflow type prepreg coincide with each other thereafter and therefore, the wiring lead-out port can easily be formed and a large amount of products can easily be processed with good dimension reproducibility.

According to the multilayer printed wiring board, it is preferable that the signal circuit conductor includes a branch pattern.

Further, a method of fabricating a multilayer printed wiring board according to the invention is characterized in forming a signal circuit conductor completely covered by an earth circuit and a wiring lead-out port at an inner portion thereof by selective etching of copper with regard to a cladding sheet for the multilayer printed wiring board manufactured by bringing a copper foil material and a nickel foil material into press contact with each other by a reduction of 0.1 to 3%.

According to the manufacturing method, it is preferable that the cladding sheet for the multilayer printed wiring board comprises five layers of copper/nickel/copper/nickel/copper.

Further, according to the manufacturing method, it is preferable that the cladding sheet for the multiplayer printed wiring board is manufactured by bringing the copper foil material provided with nickel plating at one face or two faces thereof and other copper foil material or a copper foil material provided with nickel plating at one face thereof into press contact with each other by the reduction of 0.1 to 3%.

Further, a method of fabricating a multilayer printed wiring board according to the invention is characterized in forming a signal circuit conductor completely covered by an earth circuit at an inner portion thereof by selective etching of copper with regard to a cladding sheet for the multilayer printed wiring board manufactured by bringing a copper foil material and a silver foil material into press contact with each other by a reduction of 0.1 to 3%.

According to the manufacturing method, it is preferable that the cladding sheet for the multilayer printed wiring board comprises three layers of copper/silver/copper.

Further, according to the manufacturing method, it is preferable that the cladding sheet for the multilayer printed wiring board is manufactured by bringing a copper foil material provided with silver plating at one face thereof and other copper foil material into press contact with each other by a reduction of 0.1 to 3%.

Further, it is preferable that the manufacturing method is carried out by forming a resist pattern for forming a circuit shield wall and for forming a wiring lead-out port at the copper layer on the one face of the cladding sheet for the multilayer printed wiring board, thereafter carrying out selective etching of copper to thereby form the circuit shield wall and the wiring lead-out port, removing the nickel layer, successively coating an insulating resin on an etching face, thereafter forming a resist pattern for forming a circuit shield wall at a copper layer on a rear face of the cladding sheet, thereafter carrying out selective etching of copper to thereby form the circuit shield wall, etching the intermediate copper layer to thereby form a signal circuit, coating an insulating resin on an etching face and plating copper on two faces thereof to thereby form the shield wall.

Further, it is preferable that the manufacturing method is carried out by forming a resist pattern for forming a circuit shield wall or for forming the wiring lead-out port at the copper layer on one face of the cladding sheet with regard to the cladding sheet for a multilayer printed wiring board, thereafter carrying out selective etching of copper to thereby form the circuit shield wall, successively coating an insulating resin on an etching face, thereafter forming a resist pattern for forming a circuit shield wall at the copper layer on a rear face of the cladding sheet, thereafter carrying out selective etching of copper to thereby form the circuit shield wall, forming a signal circuit by etching the intermediary copper layer, coating an insulating resin on an etching face and thereafter plating copper at other than a portion for constituting a wiring lead-out port to thereby form the shield wall.

Further, according to the manufacturing method, it is preferable that the signal circuit conductor is constituted by a shape including a branch pattern.

Further, a method of forming a wiring lead-out port in a multilayer printed wiring board according to the invention is characterized in forming a resist pattern for forming the wiring lead-out port at a copper layer on one face of a cladding sheet for a multilayer printed wiring board, thereafter carrying out selective etching of copper to thereby form a shield wall of the wiring lead-out port, removing a nickel layer, successively coating an insulating resin on an etching face, thereafter etching a copper layer on a rear face of the cladding sheet and coating an insulating resin on an etching face.

Further, a method of forming a wiring lead-out port in a multilayer printed wiring board according to the invention, is characterized in forming a resist pattern for forming the wiring lead-out port at a copper layer on one face of a cladding sheet for the multiplayer printed wiring board, thereafter carrying out selective etching of copper to thereby form a shield wall of the wiring lead-out port, thereafter successively coating an insulating resin on an etching face, thereafter etching a copper layer on a rear face of the cladding sheet to thereby form a circuit shield wall, forming a signal circuit by etching the intermediary silver layer and coating an insulating resin on an etching face.

BEST MODE FOR CARRYING OUT THE INVENTION

The invention provides a multilayer printed wiring board characterized in including a signal circuit conductor completely covered by an earth circuit at an inner portion thereof and providing a wiring lead-out port. A multilayer printed wiring board according to the invention can be manufactured as follows.

As a material of manufacturing a multilayer printed wiring board, it is preferable to use a cladding sheet for a printed wiring board.

As a cladding sheet for a printed wiring board, there can be pointed out a cladding sheet comprising a combination of a copper (Cu) foil material and a nickel (Ni) foil material, for example, a constitution comprising five layers of Cu/Ni/Cu/Ni/Cu.

Further, other than the above-described, there can be pointed out a cladding sheet comprising a combination of a copper foil material and a silver (Ag) foil material. As an example of the combination, for example, a constitution comprising Cu/Ag/Cu can be pointed out. Further, it is preferable to use a constitution manufactured by bringing a copper foil member provided with silver plating on one face thereof and other copper foil member into press contact with each other by a reduction of 0.1 to 3%.

Further, an explanation will be given of a multilayer printed wiring board manufactured by constituting a material thereof by the former cladding sheet comprising the combination of a copper foil material and a nickel foil material as a first embodiment of the invention and a multilayer printed wiring board constituted by the latter cladding sheet comprising a copper foil material and a silver foil material as a second embodiment of the invention. The two embodiments are basically common in view of a manufacturing method and therefore, basically, an explanation will be given of the first embodiment of the invention and thereafter, with regard to the second embodiment of the invention, only a point of difference therefrom will be pointed out.

Figure 1:
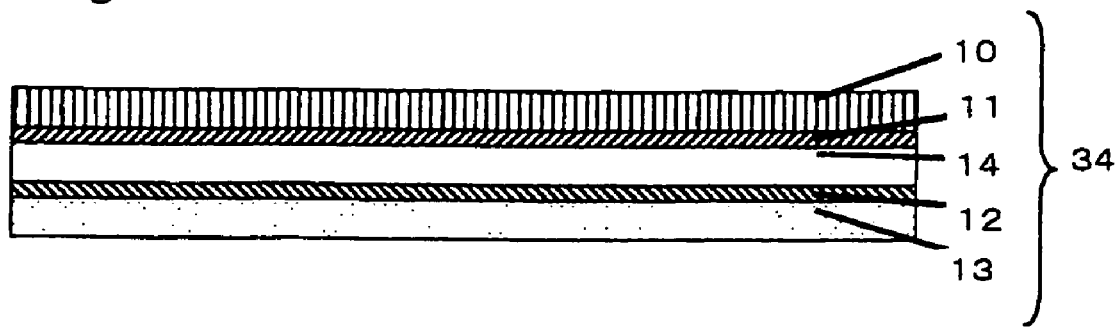
FIG. 1 is an explanatory view of steps of a method of manufacturing a multilayer printed wiring board according to the invention and is a side view of a cladding sheet for the multilayer printed wiring board.
Figure 2:
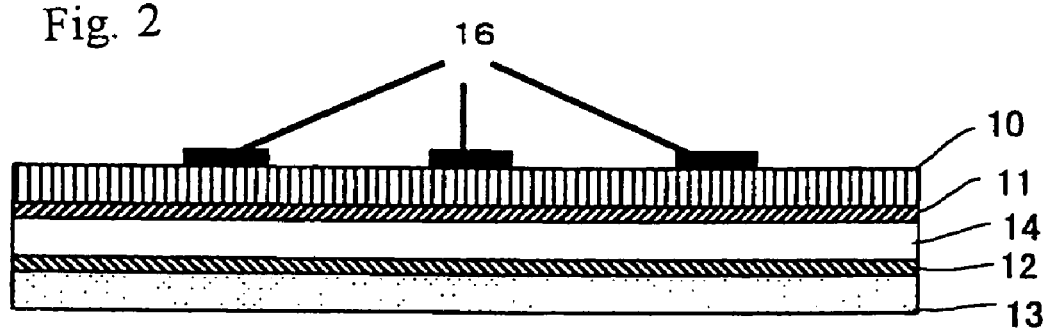
FIG. 2 is an explanatory view of steps of a method of manufacturing a multiple printed wiring board according to the invention and is a side view when a resist is coated on a cladding sheet for the multilayer printed wiring board.

Explaining an example of a structure of a multilayer printed wiring cladding sheet according to the first embodiment of the invention in reference to FIG. 1, both faces of a copper layer 14 for constituting a wiring layer (a thickness of which is preferably 10 to 100 μm) comprising a copper foil, is bonded with etching stopper layers 11 and 12 each comprising nickel plating (a thickness of which is. preferably 0.5 to 3 μm) or a nickel foil (a thickness of which is 5 to 10 μm) to thereby form a core of a base.

Further, outer sides of the two etching stopper layers are further formed with copper foil material (a thickness of which is preferably 10 to 100 μm) layers 10 and 13. These form shield walls.

Next, an explanation will be given of a method of manufacturing the multilayer printed wiring board according to the first embodiment of the invention.

First, by laminating nickel plating layers or nickel foil layers for constituting the etching stopper layers 11 and 12 on the two faces of the copper layer 14 for constituting an inner conductor layer when the multilayer printed wiring board is manufactured, to thereby manufacture a copper foil material having nickel layers. Further, although in the following description, for convenience of explanation, an explanation will be given by pointing out a case of constituting a nickel plating layer, the manufacturing can similarly be carried out also when a nickel foil is used in place thereof.

The multilayer printed wiring board according to the first embodiment can basically be manufactured by bringing a copper foil material for constituting a conductor layer or the like and a laminated member of a nickel foil material or nickel plating for forming an etching stop layer into cold rolled press contact with each other by a reduction of 0.1 to 3%.

In cold rolled press contact, an activation treatment is previously carried out for the respective materials. As previously disclosed in Japanese Patent Laid-Open No. 224184/1989 by the applicant, the activation treatment can be carried out as follows, (1) under an extremely low pressure inert gas atmosphere of $1.33 \times 10$ to $1.33 \times 10^{-2}$ Pa, (2) there is constituted one electrode A by the copper foil and the nickel layer having a bonding faces or the copper foil and the silver layer having bonding face respectively grounded to earth, alternating current of 1 to 50 MHz is applied between the one electrode A and other electrode B insulatively supported to thereby carry out glow discharge, (3) further, an area of the electrode exposed in plasma produced by the glow discharge is equal to or smaller than ⅓ of the area of the electrode B and (4) the materials are subjected to a sputter etching treatment.

Figure 21:
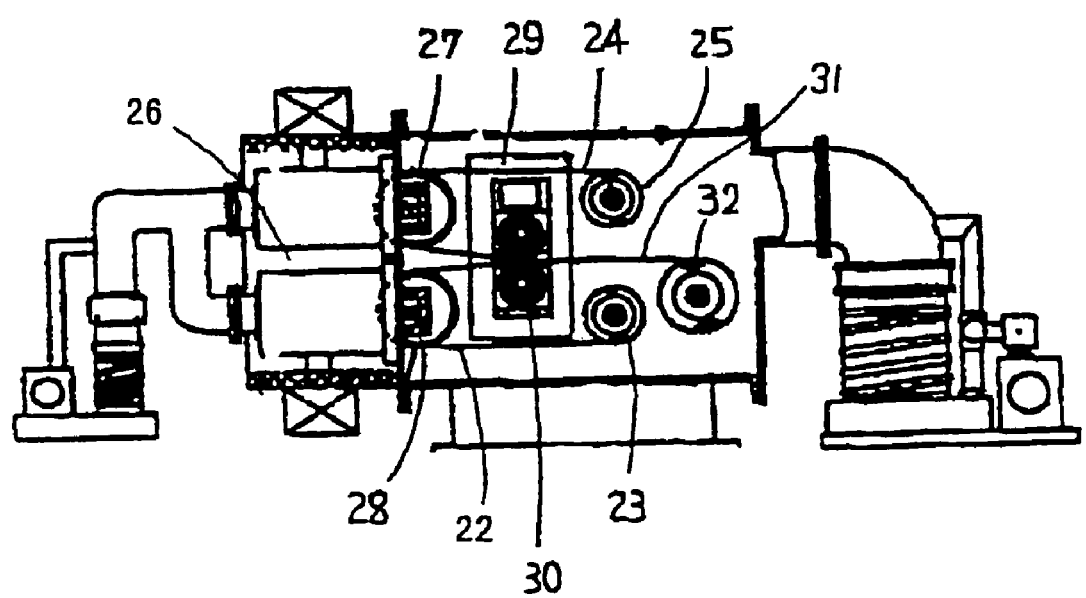
FIG. 21 is a front sectional view of an apparatus of manufacturing a cladding metal sheet according to the invention.

Actually, for example, a nickel-plated copper foil material is wound around a payoff reel 23 in a cladding sheet manufacturing apparatus shown in FIG. 21. Further, the copper foil material 10 for constituting a columnar conductor 17 is wound around a payoff reel 25. The nickel-plated copper foil material 11, 12 and the copper foil material 14 are simultaneously paid off from the payoff reels 23 and 25 and portions thereof are wound around electrode rolls 27 and 28 projected into an etching chamber 26 and activated by being subjected to sputter etching treatment at inside of the etching chamber 26.

Thereafter, the materials are brought into cold rolled press contact by a rolling unit 30 provided at inside of a vacuum tank 29 and a cladding sheet 31 for a semiconductor package unit having a three layers structure is reeled by a reeling roll 32.

Next, the cladding sheet 31 for the semiconductor package unit having the three layers structure is again wound around the payoff reel 23. Further, a copper foil material 33 for constituting the shield wall 18 (refer to FIG. 1) is wound around the payoff reel 25. The cladding sheet 31 and the copper foil material 33 are respectively paid off from the payoff reels 23 and 25 and portions thereof are wound around the electrode rolls 27 and 28 projected into the etching chamber 26 and activated by being subjected to the sputter etching treatment at inside of the etching chamber 26. Also in this case, the activation treatment is carried out under a condition similar to the above-described.

A cladding sheet 34 for a printed wiring board having the five layers structure according to the first embodiment of the invention is provided in this way as shown by FIG. 1.

Further, by repeatedly carrying out press contact by using the above-described facility, there can be manufactured the cladding sheet of multiple layers provided with the copper layers at a surface layer and a rear face layer thereof and interposed with the nickel layers at intermediate layers thereof in an order of copper/nickel/copper/nickel/copper.

Further, by providing three pieces or more of the payoff reels, installing the copper foil material, the nickel foil material and the like at these reels and receiving supply of the foil materials simultaneously from three pieces or more of the reels, a cladding sheet having a multilayer structure can be manufactured by a single time of press contact.

Further, with regard to the cladding sheet for a printed wiring board comprising the copper foil material and the silver foil material according to the second embodiment of the invention, there is shown an example of a constitution comprising three layers of copper/silver/copper. The constitution is also manufactured by bringing the copper foil material for forming a conductor layer or the like and the silver foil material or a silver plating laminated member into cold rolled press contact by a reduction of 0.1 to 3% and the cladding sheet can be manufactured similar to the cladding sheet according to the first embodiment.

The cladding sheet for the multilayer printed wiring board formed in this way, is made to constitute the multilayer printed wiring board having a signal circuit conductor completely covered by an earth circuit at an inner portion thereof by cutting the cladding sheet into a desired size and selectively etching copper.

The selectively etching can be carried out to form a desired circuit. Therefore, the board cannot only be formed with a circuit of a straight line but also a circuit having complicated branching.

An explanation will be given of the case of the multiplayer printed wiring board according to the first embodiment of the invention, that is, a case of using the cladding sheet of five layers of copper, nickel, copper, nickel and copper material of FIG. 1 as a raw material.

Figure 3:
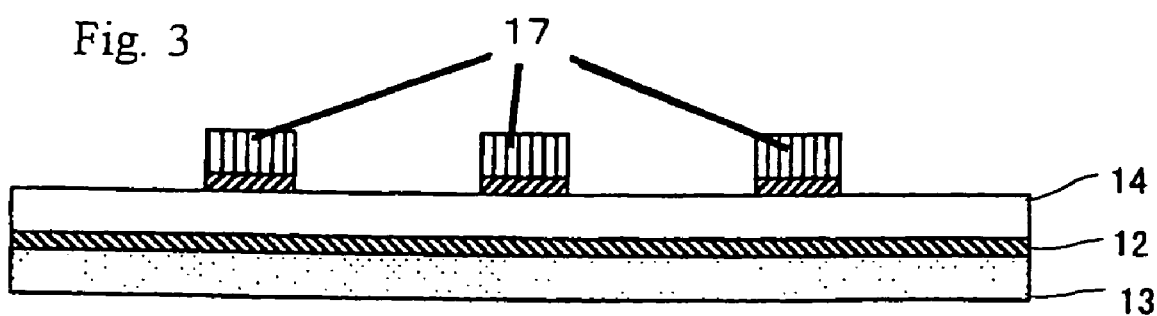
FIG. 3 is an explanatory view of steps of a method of manufacturing a multilayer printed wiring board according to the invention and is a side view after selective etching of copper and removing a nickel layer.

First, selective etching of the copper foil material 10 is carried out and the copper foil material 10 is dissolved and removed while leaving the columnar conductor 17. Successively, an etching solution is changed to a nickel etching solution and the nickel layer 11 is removed. A state after removal is shown by FIG. 3. Further, the columnar conductor 17 which remains at the time point constitutes a shield wall or the wiring lead-out port.

As the etching solution of the copper foil material, it is preferable to use an aqueous solution of sulfuric acid+ hydrogen peroxide or an aqueous solution of persulfuric acid hydrogen ammonium, further, as the nickel etching solution, it is preferable to use, for example, Melstrip N-950 of Meltex Corp. or the like on sale.

Further, although the etching treatment is carried out by dipping a treated object in the etching aqueous solution, the etching treatment may be carried out by spraying the etching aqueous solution or dropping the aqueous solution onto an etched face. In the case of spraying or dropping the etching solution, it is sufficient that a resist treatment is carried out by a method of subjecting only an uppermost layer to spinner coating. When the etching treatment is carried out by dipping the object in the etching solution, the object is dipped to etch in a bath of the etching solution at 50° C. for about 1 to 10 minutes, however, with regard to individual bath temperature and dipping time, optimum conditions can be determined depending on an amount of operation, a time period or the like.

Figure 4:
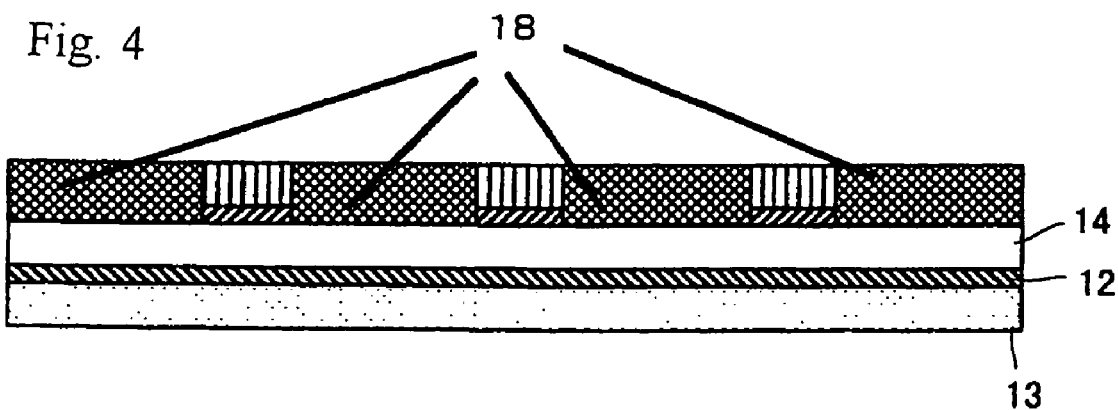
FIG. 4 is an explanatory view of steps of a method of manufacturing a multilayer printed wiring board according to the invention and is a side view when insulating resin is coated.

Next, an insulating resin layer 18 is formed by coating insulating resin at voids after the etching treatment, a surface thereof is polished and a surface of the columnar conductor layer 17 is exposed (FIG. 4). As the insulating resin in this case, epoxy resin, polyimide resin or the like can be used.

Figure 5:
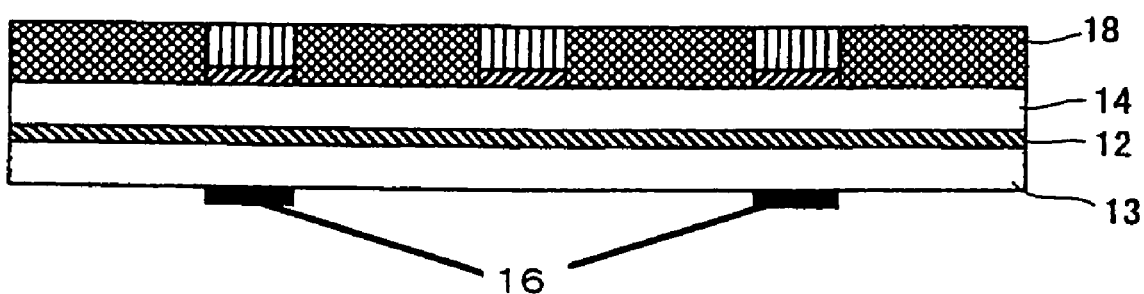
FIG. 5 is an explanatory view of steps of a method of manufacturing a multilayer printed wiring board according to the invention and is a side view when a resist is coated.

Meanwhile, a photoresist similar to the above-described is coated on a surface of the copper foil material 13 on a side opposed to the face at which the copper foil material 10 has been present (refer to FIG. 5). Here, it is important that the resist is not coated on a portion for forming a wiring lead-out port in finishing the object.

Figure 6:
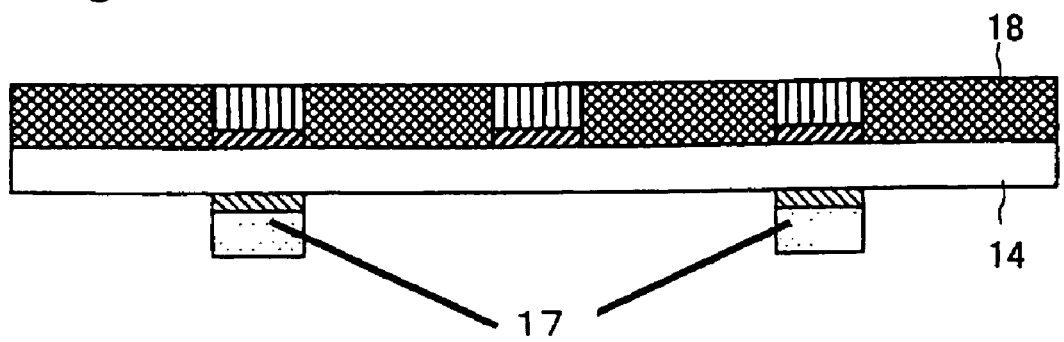
FIG. 6 is an explanatory view of steps of a method of manufacturing a multilayer printed wiring board according to the invention and is a side view after selective etching of copper and removing a nickel layer.

Successively, selective etching of the copper foil material 13 is carried out, the copper foil material is dissolved and removed while leaving the columnar conductor layer 17, further, the etching solution is changed and also the nickel layer 12 is removed (FIG. 6). The portion of constituting the columnar conductor 17 in this case, finally forms the shield wall (refer to notation 21 of FIG. 10). Further, the etching solutions similar to those at the previous time can be used.

Figure 7:
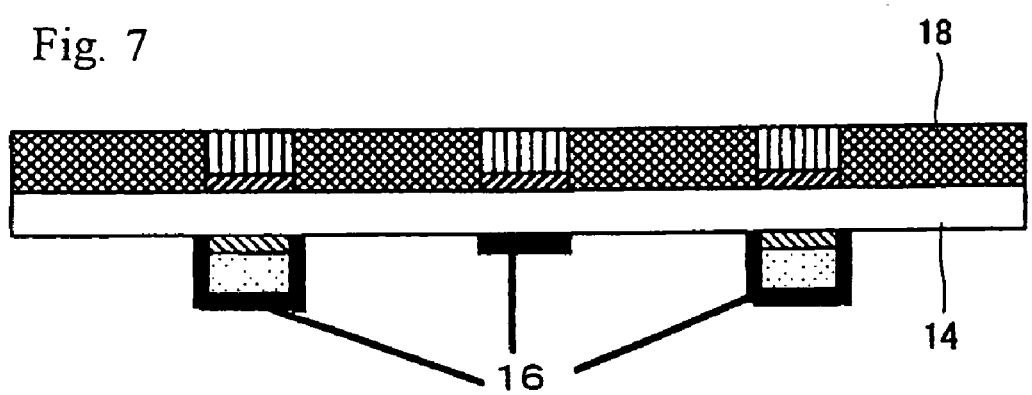
FIG. 7 is an explanatory view of steps of a method of manufacturing a multilayer printed wiring board according to the invention and is a side view when a resist is coated.
Figure 8:
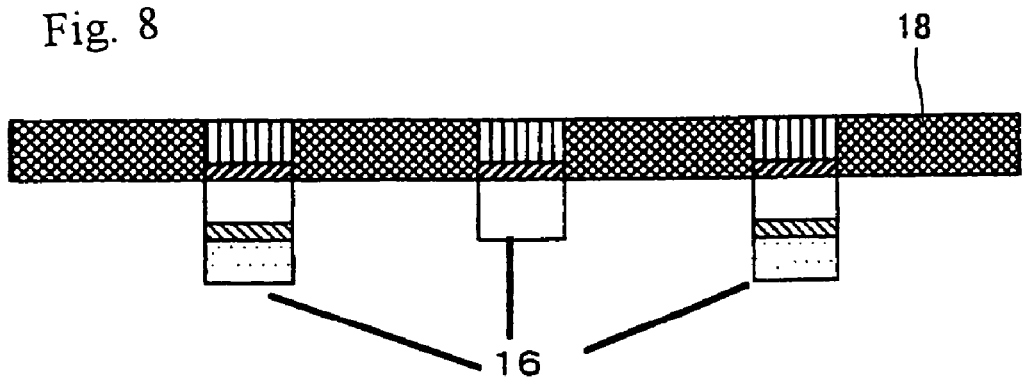
FIG. 8 is an explanatory view of steps of a method of manufacturing a multilayer printed wiring board according to the invention and is a side view after copper etching.

Next, as shown by FIG. 7, a photoresist is coated one more time. At this occasion, the resist is coated also at a portion for constituting the wiring lead-out port. Successively, the object is exposed and developed and thereafter, the intermediate copper layer 14 is removed by selective etching as shown by FIG. 8. The etching solution in this case is similar to the above-described.

Figure 9:
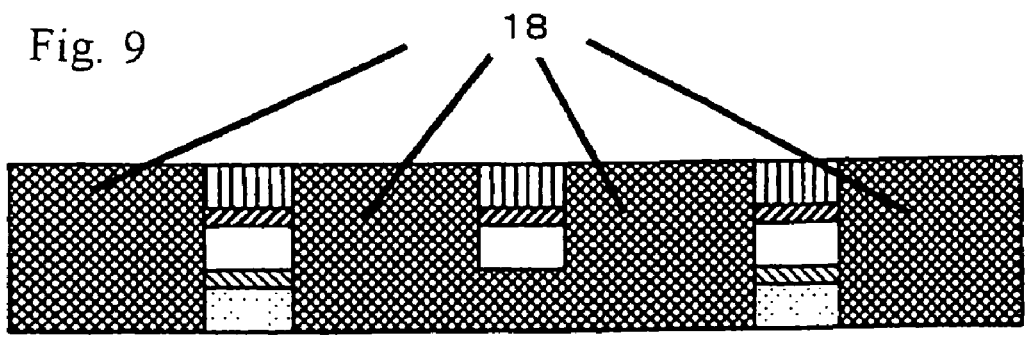
FIG. 9 is an explanatory view of steps of a method of manufacturing a multilayer printed wiring board according to the invention and is a side view after coating insulating resin.

After selective etching of the intermediate copper layer has been finished, voids after etching are filled with insulating resin comprising epoxy resin, polyimide resin or the like similar to that in the previous time, the resin layer 18 is formed (refer to FIG. 9), successively, surface polishing is carried out to thereby expose the surface of the columnar conductor 17. Further, an upper layer of an exposed portion of the columnar conductor for forming a signal circuit, is coated with a photoresist layer 16, exposed and developed.

Figure 10:
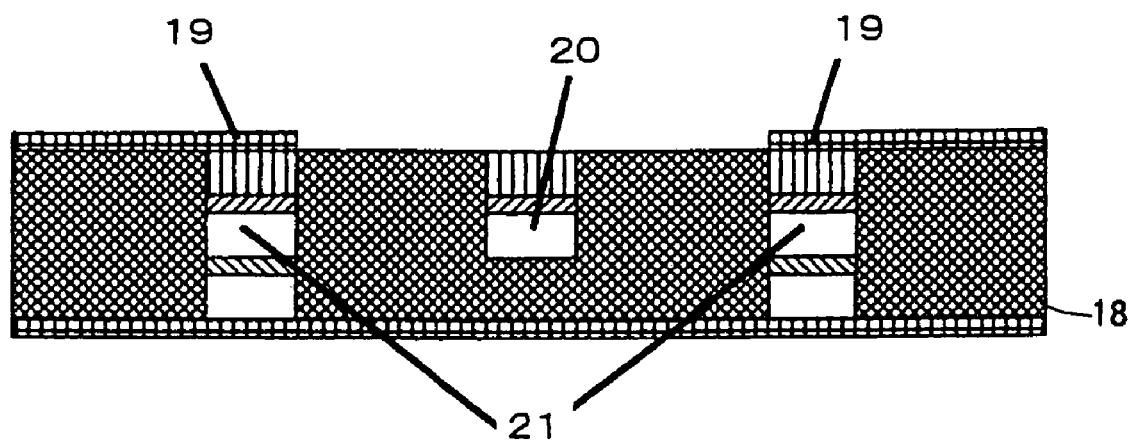
FIG. 10 is an explanatory view of steps of a method of manufacturing a multilayer printed wiring board according to the invention and is a side view after coating copper by electroless plating.

Next, as shown by FIG. 10, a total except the wiring lead-out port portion, is covered by an electroless copper plating layer 19 to thereby constitute the shield wall. In this way, there is finished the multilayer printed wiring board formed with the signal circuit conductor completely covered by the earth circuit and the lead-out port at an inner portion thereof.

Next, an explanation will be given of a case of a board of three layers according to the second embodiment of the invention. Except that the cladding sheet is constituted by three layers, by carrying out selective etching of copper similar to the case of the first embodiment, there can be manufactured the multilayer printed wiring board formed with the signal circuit conductor completely covered by the earth circuit at an inner portion thereof.

Although treating operation of the three layers board is basically the same as in the case of the five layers board according to the first embodiment, since the etching stopper layer is not present, the step of removing the etching stopper layer can be saved.

Figure 11:
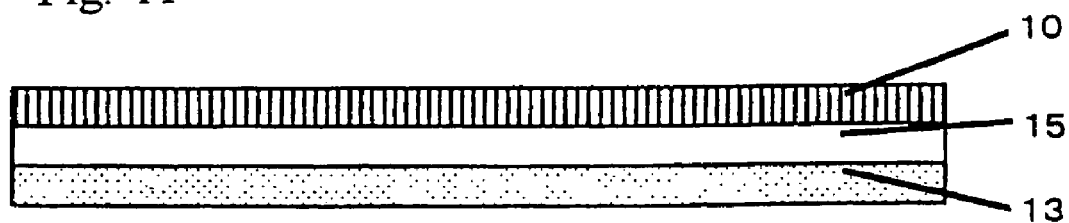
FIG. 11 is an explanatory view of steps of a method of manufacturing a multilayer printed wiring board according to the invention and is a side view of a cladding sheet for a multilayer printed wiring board.
Figure 12:
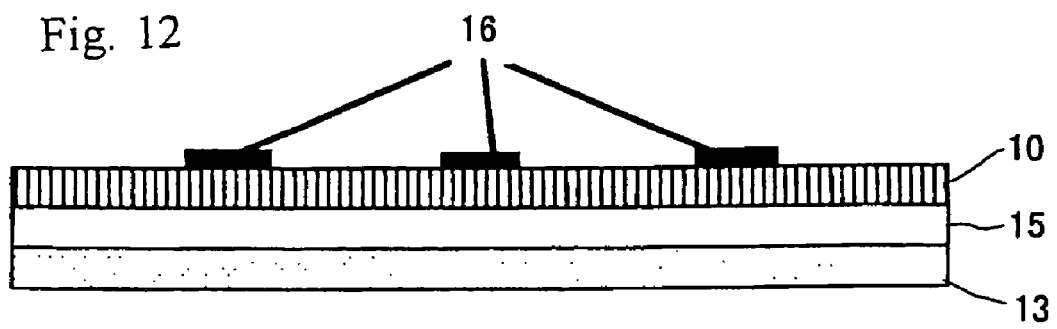
FIG. 12 is an explanatory view of steps of a method of manufacturing a multilayer printed wiring board according to the invention and is a side view after coating a resist.

First, the cladding sheet having the three layer structure as shown by FIG. 11 is prepared and as shown by FIG. 12, after forming the photoresist film 16 on the surface of the copper foil material 10, the object is exposed and developed.

Figure 13:
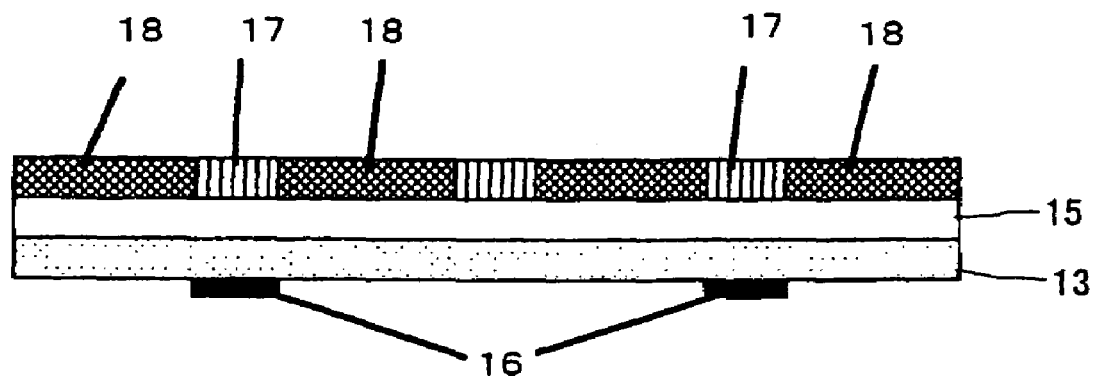
FIG. 13 is an explanatory view of steps of a method of manufacturing a multilayer printed wiring board according to the invention and is a side view after coating insulating resin and coating a resist.

Next, selective etching of the copper foil material 10 is carried out and the copper foil material 10 is dissolved and removed while leaving the columnar conductor 17. Successively, insulating resin is coated and filled in voids after the etching treatment to form the insulating layer 18, further, a surface thereof is polished and a surface of the columnar conductor 17 is exposed. The state is shown by FIG. 13. As insulating resin, epoxy resin, polyimide resin or the like is used.

Figure 14:
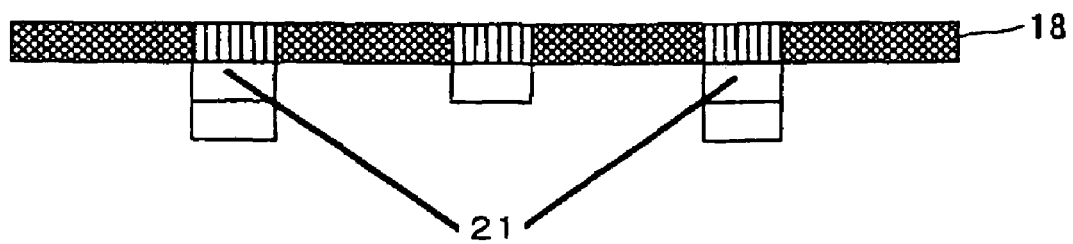
FIG. 14 is an explanatory view of steps of a method of manufacturing a multilayer printed wiring board according to the invention and is a side view after etching and coating insulating resin.

Thereafter, the photoresist 16 is coated on the surface of the copper foil material 13 on other face similar to the first embodiment except the portion of the wiring lead-out port (refer to FIG. 13) selective etching of the copper foil material 13 is carried out, successively, selective etching of the silver foil material 15 is carried out by using an aqueous solution of ferric nitrate as the etching solution and the copper foil material and the silver foil material are dissolved and removed while leaving the columnar conductor 17 (refer to FIG. 14).

Figure 15:
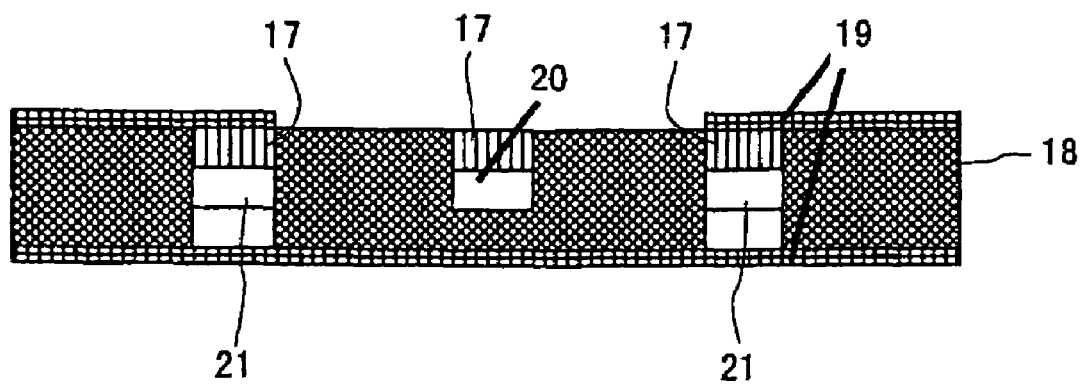
FIG. 15 is an explanatory view of steps of a method of manufacturing a multilayer printed wiring board according to the invention and is a side view after plating copper by electroless plating.

Finally, as shown by FIG. 15, voids after etching are filled with insulating resin comprising epoxy resin or polyimide resin similar to that in the previous time to thereby form the insulating resin layer 18 (refer to FIG. 14), electroless copper plating is carried out to a total of the element and the total is covered by a copper material while leaving a signal circuit forming portion to thereby constitute the shield wall (refer to FIG. 15).

Figure 16:
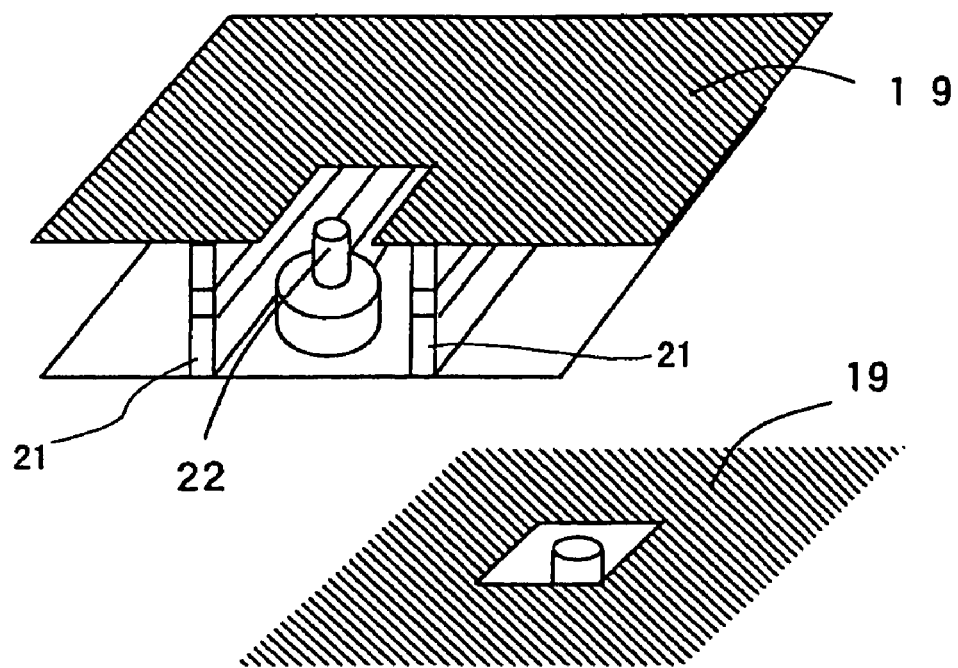
FIG. 16 is a perspective view of a portion of a wiring lead-out port of a multilayer printed wiring board according to the invention.

In this way, the multilayer printed wiring board according to the invention provided with the wiring lead-out port is manufactured (refer to FIG. 16).

Figure 17:
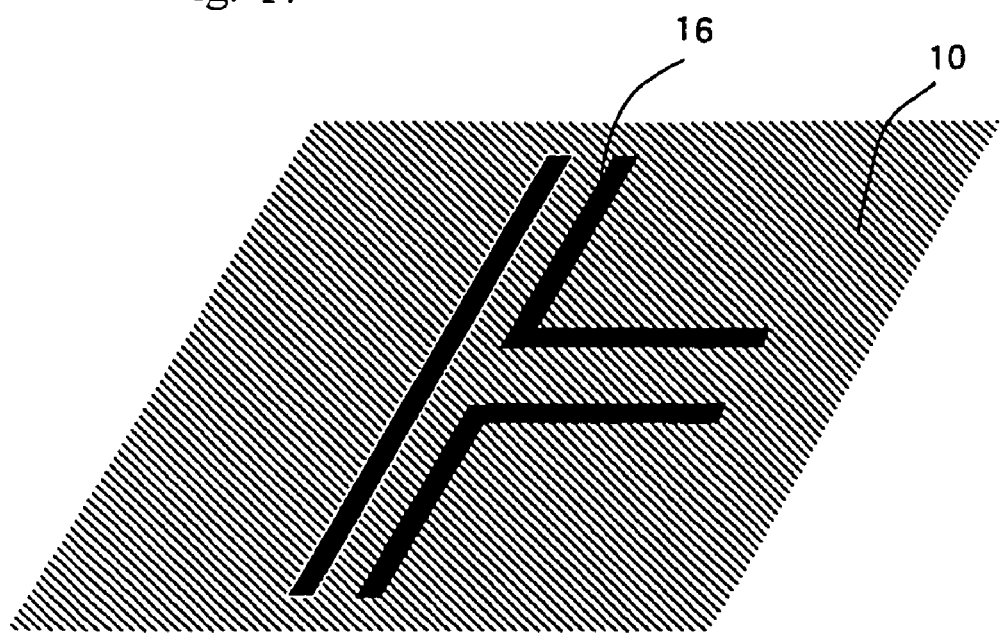
FIG. 17 is a plane view showing a resist pattern when a wiring board branched in a multilayer printed wiring board according to the invention is intended to form.
Figure 18:
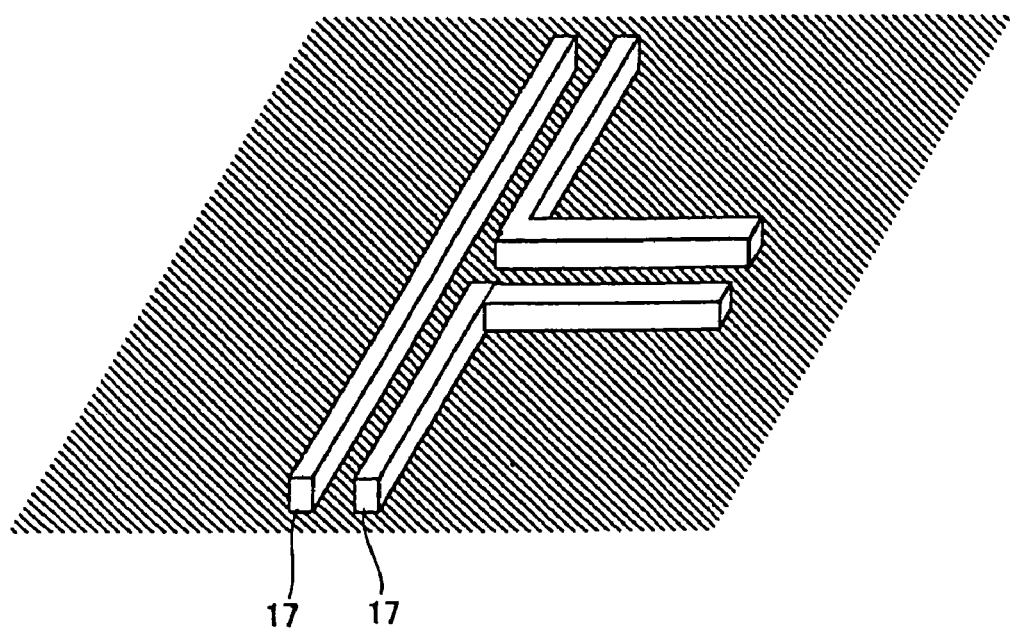
FIG. 18 is a three-dimensional view showing a state after etching when a wiring board branched in a multilayer printed wiring board according to the invention is intended to form.
Figure 19:
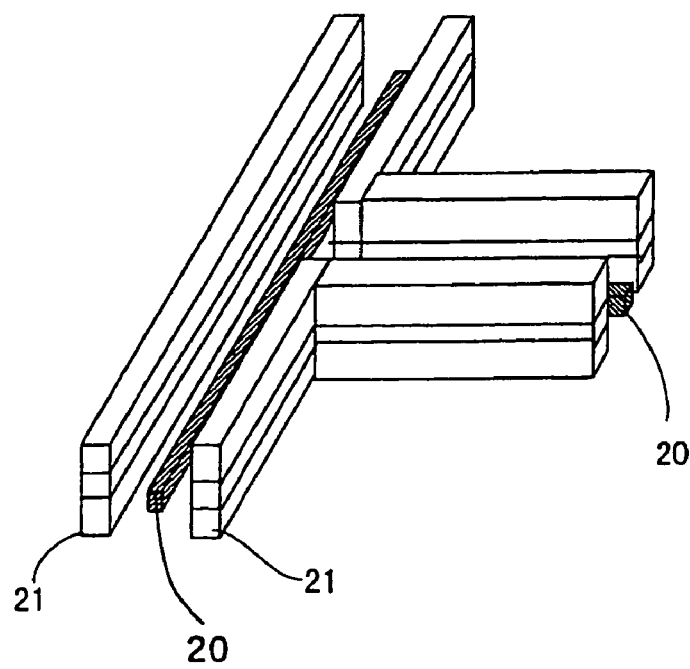
FIG. 19 is a three-dimensional view showing an example of a signal circuit of a wiring board branched in a multilayer printed wiring board according to the invention.
Figure 20:
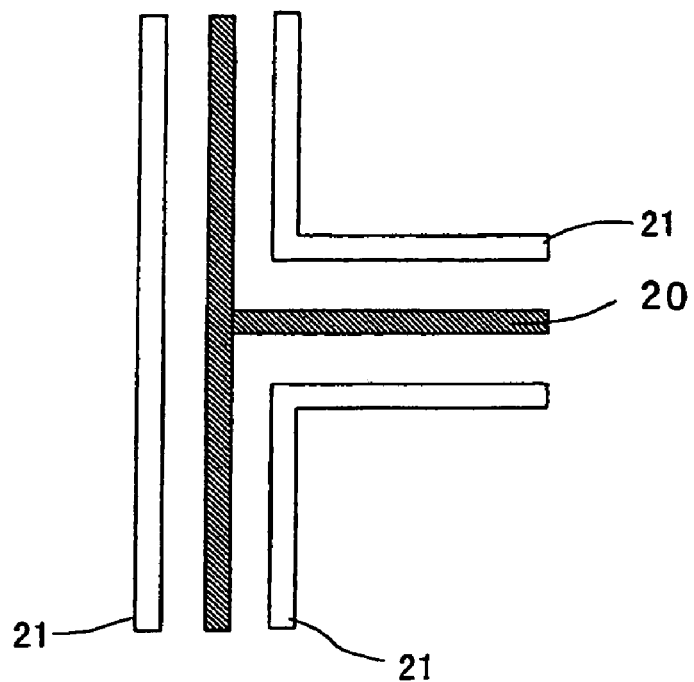
FIG. 20 is a plane view showing an example of a signal circuit of a wiring board branched in a multilayer printed wiring board according to the invention.

When a board for a signal wiring in a branch pattern is intended to manufacture, in compliance with a desired wiring shape, a resist pattern is drawn in the above-described manufacturing steps. For example, when a board for a wiring in a T-like shape is intended to manufacture, after drawing a resist pattern as shown by FIG. 17 on the copper foil material, by carrying out selective etching, a shield wall as shown by FIG. 18 is provided. Further, when the steps are successively processed, a signal circuit having a desired T-like shape is formed (refer to FIG. 19, FIG. 20). By the principle, not only the T-like circuit but also a complicated circuit can easily be formed.

INDUSTRIAL APPLICABILITY

The multilayer printed wiring board according to the invention can easily be manufactured by the simple method of repeating the etching treatment by using the cladding sheet of a plurality of layers provided by press bonding. Further, wiring lead-out port can easily be provided and a large amount of products can easily be manufactured with good size reproducibility. Particularly, even the multilayer printed wiring board having a complicated wiring structure can easily be manufactured and therefore, the invention is industrially useful.

What is claimed is:

1. A method for manufacturing a multilayer printed wiring board comprising a signal circuit conductor completely covered by a ground circuit and a wiring lead-out port at an inner portion of said signal circuit conductor, wherein the signal circuit conductor is formed by selective etching of copper on a cladding sheet;

comprising producing a cladding sheet comprising five layers of copper/nickel/copper/nickel/copper by press contacting copper foil and nickel foil such that the reduction is form 0.1 to 3%.

2. The method according to claim 1, wherein the cladding sheet for the multilayer printed wiring board is manufactured by press contacting a first copper foil material plated with nickel foil at one face or two faces of the first copper foil with a second copper foil optionally coated on one face with nickel foil whereby the composite so formed is reduced by from 0.1 to 3%.

3. The method according to claim 1, wherein the cladding sheet for the multilayer printed wiring board is manufactured by press contacting a first copper foil material having silver plating on one face thereof with a second copper foil material, whereby the composite so formed has a reduction of 0.1 to 3%.

4. The method according to claim 1, further comprising:
   a. forming a resist pattern for forming a circuit shield wall and for forming the wiring lead-out port at the copper layer on one face of the cladding sheet for the multilayer printed wiring board;
   b. selectively etching copper to form the circuit shield wall and the wiring lead-out port;
   c. removing the nickel layer immediately under the copper layer;
   d. coating an insulating resin on an etching face;
   e. forming a resist pattern for forming a circuit shield wall at a copper layer on a rear face of the cladding sheet;
   f. selectively etching the copper on the rear face of the cladding sheet to form a circuit shield wall;
   g. etching the intermediate copper layer to form a signal circuit;
   h. coating an insulating resin on an etching face and plating copper onto two faces of said etching faces to form the shield wall.

5. The method according to claim 3, further comprising:
   a. forming a resist pattern for forming a circuit shield wall and for forming the wiring lead-out port at the copper layer on one face of the cladding sheet for the multilayer printed wiring board;
   b. selectively etching copper to form the circuit shield wall and the wiring lead-out port;
   c. removing the nickel layer immediately under the copper layer;
   d. coating an insulating resin on an etching face;
   e. forming a resist pattern for forming a circuit shield wall at a copper layer on a rear face of the cladding sheet;
   f. selectively etching the copper on the rear face of the cladding sheet to form a circuit shield wall;
   g. etching the intermediate copper layer to form a signal circuit; and
   h. coating an insulating resin on an etching face and plating copper onto two faces of said etching faces to form the shield.

6. The method according to claim 4, wherein the signal circuit conductor comprises a branch pattern.

7. The method according to claim 5, wherein the signal circuit conductor comprises a branch pattern.

8. The method according to claim 1, further comprising:
   a. selectively etching copper to form a shield wall for the wiring lead-out port;
   b. remove a nickel layer;
   c. successively coating an insulating resin on an etching face;
   d. thereafter etching a copper layer on a rear face of the cladding sheet; and
   e. coating an insulating resin on the etching face.

9. The method according to claim 3, further comprising:

a. selectively etching copper to form a shield wall for the wiring lead-out port;
b. removing a nickel layer;
c. successively coating an insulating resin on an etching face;
d. thereafter etching a copper layer on a rear face of the cladding sheet; and
e. coating an insulating resin on the etching face.

10. The method according to claim 4, further comprising:
a. selectively etching copper to form a shield wall for the wiring lead-out port;
b. removing a nickel layer;
c. successively coating an insulating resin on an etching face;
d. thereafter etching a copper layer on a rear face of the cladding sheet; and
e. coating an insulating resin on the etching face.

11. The method according to claim 10, wherein the signal circuit conductor comprises a branch pattern.

* * * * *